United States Patent [19]

Takada

[11] Patent Number: 5,437,276

[45] Date of Patent: Aug. 1, 1995

[54] APPARATUS FOR MEASURING MAGNETIC SOURCES

[75] Inventor: Youichi Takada, Chiba, Japan

[73] Assignee: Kabushiki Kaisha Toshiba, Kawasaki, Japan

[21] Appl. No.: 96,468

[22] Filed: Jul. 23, 1993

[30] Foreign Application Priority Data

Jul. 24, 1992 [JP]  Japan .................................. 4-198638

[51] Int. Cl.$^6$ ................................................ A61B 5/05
[52] U.S. Cl. ................................. 128/653.1; 324/244; 324/248; 324/249
[58] Field of Search ........................... 128/653.1, 731; 324/244, 248, 249

[56] References Cited

U.S. PATENT DOCUMENTS

| | | | |
|---|---|---|---|
| 4,004,217 | 1/1977 | Gifford | 324/248 |
| 4,749,946 | 6/1988 | Hoenig | 324/248 |
| 4,793,355 | 12/1988 | Crum et al. | |
| 4,801,882 | 1/1989 | Daalmans | 128/653.1 |
| 4,913,152 | 4/1990 | Ko et al. | 128/653.1 |
| 5,136,242 | 8/1992 | Abraham-Fuchs | 324/248 |
| 5,152,288 | 10/1992 | Hoenig et al. | 324/248 X |
| 5,204,624 | 4/1993 | Ueda | 324/248 |
| 5,264,793 | 11/1993 | Lo et al. | 324/244 X |
| 5,323,777 | 6/1994 | Ahonen et al. | 128/653.1 |

FOREIGN PATENT DOCUMENTS

| | | |
|---|---|---|
| 3-152488 | 11/1989 | Japan . |
| 3-277345 | 3/1990 | Japan . |
| 4-8347 | 4/1990 | Japan . |
| 4-210046 | 12/1990 | Japan . |

OTHER PUBLICATIONS

"Biomagnetism", S. J. Williamson et al., Journal of Magnetism and Magnetic Materials 22 (1981), 129, 130, 147–160, North–Holland Publishing Co.

"Relaxation Oscillator for Switching and Local Oscillator Applications", M. Muck et al., 197–199, SP-32, Institut fur Angewandte Physik, Giessen, Fed. Rep. of Germany.

"Simple DC-SQUID System Based on a Frequency Modulated Relaxation Oscillator", M. Muck et al., IEEE Transactions on Magnetics, 1151–1153, vol. 25, No. 2, Mar. 1989.

"Relaxation Oscillators Made of Bridge-Type Josephson Contacts", M. Muck et al., Appl. Phys. A 46, 97–101 (1988).

"A Comparison of Moving Dipole Inverse Solutions Using EEG's and MEG's", B. Neil Cuffin, IEEE Transactions on Biomedical Engineering, 905–910, vol. BME-32, No. 11, Nov. 1985.

"Integrated dc SQUID Magnetometer with High dV/dB", D. Drung et al., IEEE Transactions on Magnetics, 3001–3004, vol. 27, No. 2, Mar. 1991.

"SQUID Systems Overview" by Dictmar Drung, pp. 252–259.

"Interpreting Measured Magnetic Fields of the Brain: Estimates of Current Distributions", by Matti S. Hamalainen et al., Low Temperature Labortory, Helsinki University of Tech., Finland, Report TKK-F-A559 (1984), Dec. 1984.

*Primary Examiner*—Lee S. Cohen
*Assistant Examiner*—Brian L. Casler
*Attorney, Agent, or Firm*—Ronald L. Yin; Limbach & Limbach

[57] ABSTRACT

There is provided an apparatus for measuring magnetic sources that exist in an object and produce magnetic fields outside the object. The apparatus comprises an element for detecting the magnetic fields which has a sensing portion placed in proximity with the object and adapted to incorporate an observing plane. The observing plane consists of a plurality of sensing blocks each containing at least three sensing planes on which a magnetic sensor is each mounted. The normal directions of the sensing planes are different from each other. The apparatus further comprises an element for evaluating three-dimensionally the intensities of other magnetic fields at given evaluation positions on the basis of values of the magnetic fields at the detecting element, and an element for obtaining data of the magnetic sources on the basis of the intensities of the other magnetic fields evaluated by the evaluation element.

29 Claims, 12 Drawing Sheets

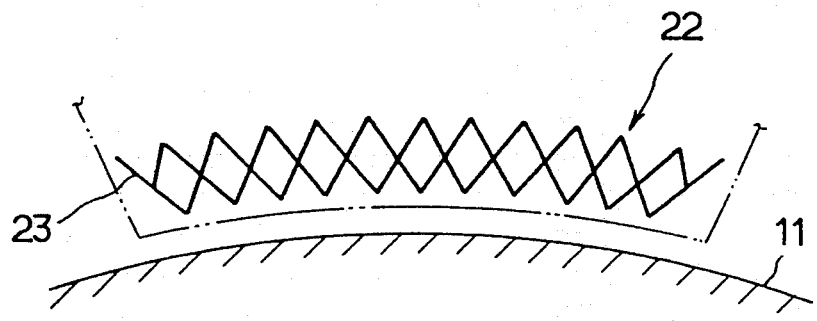
F I G. 9
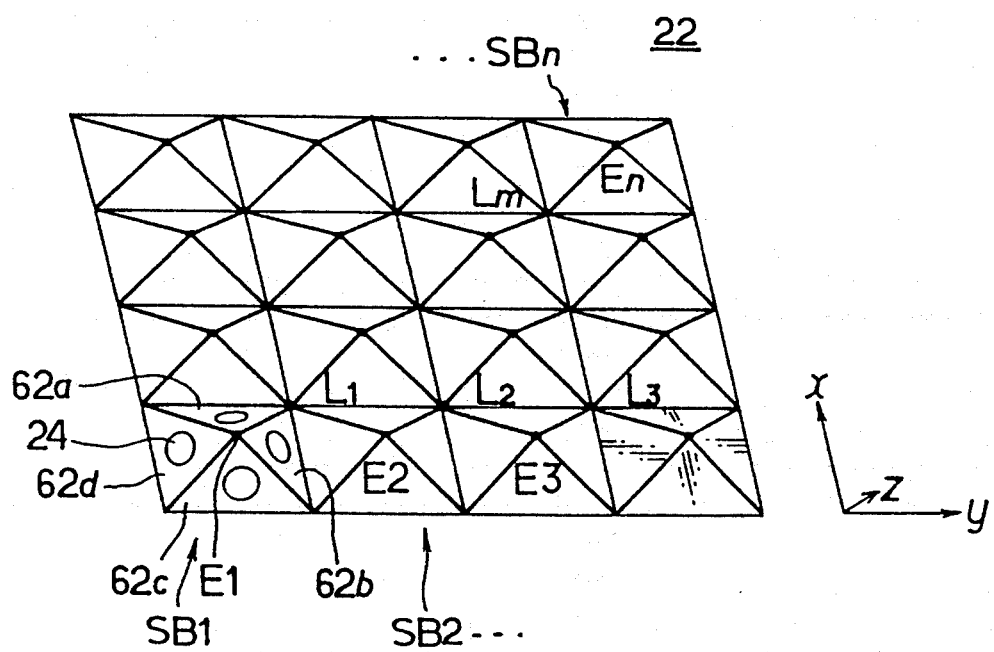
F I G. 11

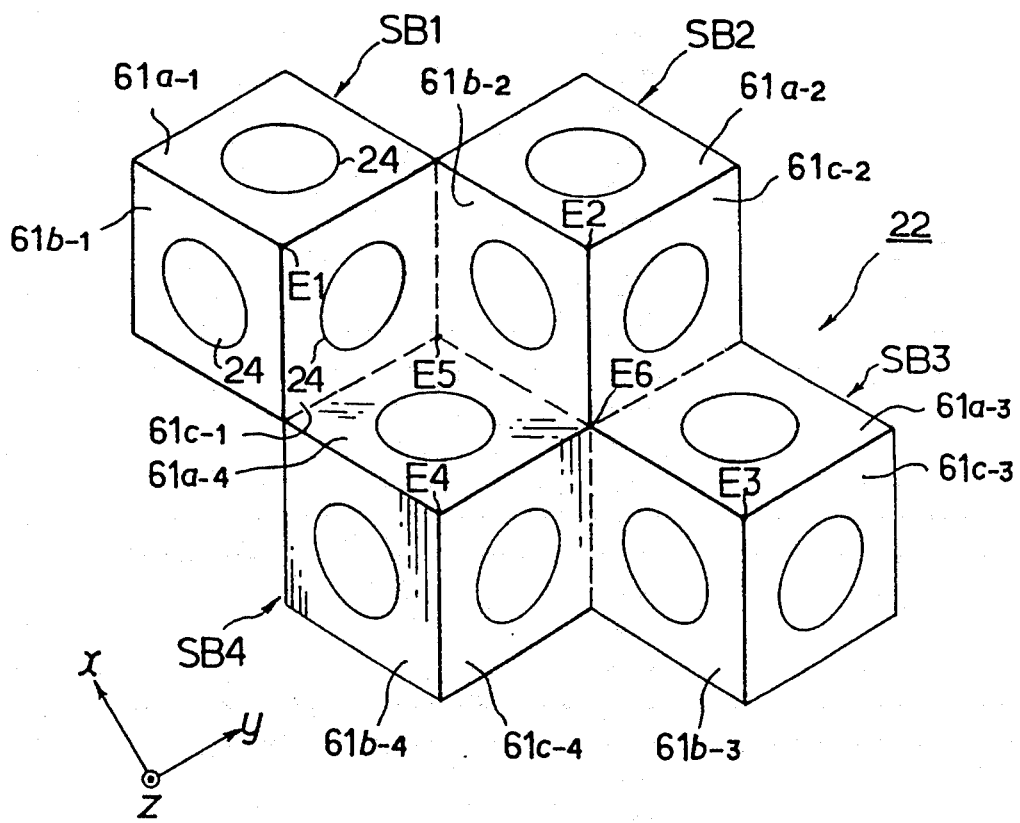
F I G. 10
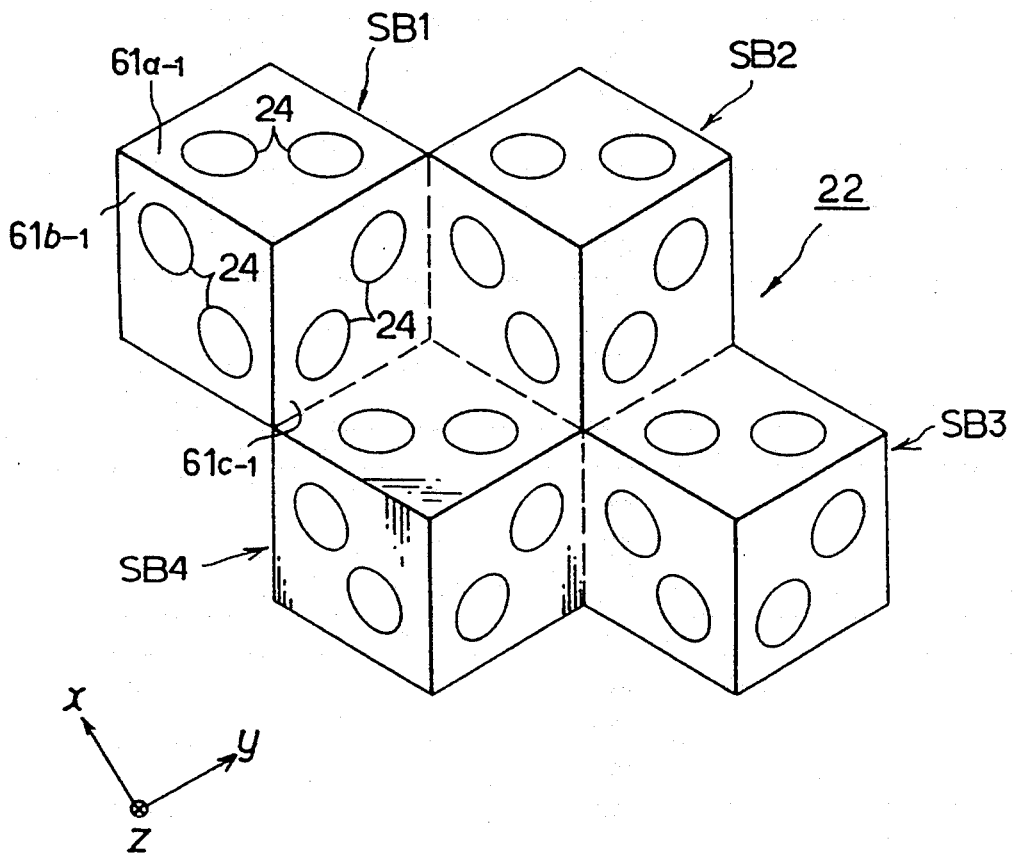
F I G. 12

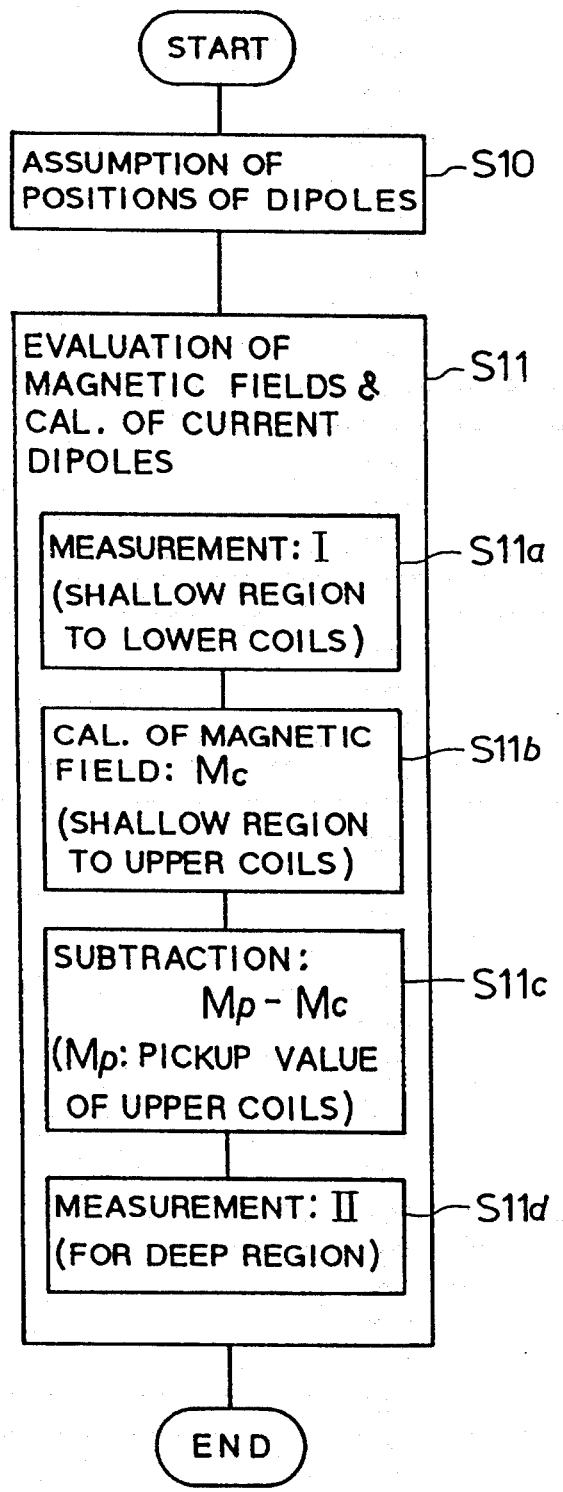
F I G. 15

APPARATUS FOR MEASURING MAGNETIC SOURCES

BACKGROUND OF THE INVENTION

The present invention relates to an apparatus for measuring sources of magnetic fields, and in particular, to the apparatus having a SQUID (Superconducting Quantum Interference Device) for detecting magnetism generated from, for example, a living body to be examined.

A technique for sensitively measuring the data of sources of magnetic fields has become an important factor in the fields of, for instance, biomagnetism measurement and resource search. In a measuring apparatus to achieve such measurements, there is often preferably provided a SQUID as a magnetic sensor.

As is known, a SQUID contains a superconducting ring, made of a superconductor, having Josephson junctions inserted in its way and is able to detect magnetic flux as much as $10^{-5}$ to $10^{-6}$ times of a fluxoid quantum $-\phi_0 = 2.07 \times 10^{-15}$ [Wb]. Therefore, feeble magnetic flux caused by pulse currents transmitting among nerve cells can be detected. In particular, the measuring apparatus having the SQUID has been preferably used for research of nerve activities of brains which have received stimulation, such as light and sound.

A conventional apparatus for measuring sources of magnetic fields comprises an element for detecting magnetic flux generated from magnetic sources in a living body to be examined and an element for determining positions of the sources using the detected magnetic flux. The detecting element, as a typical fashion, has pickup coils magnetically picking up magnetic flux from the sources and SQUIDs detecting the picked up magnetic flux. The number of the pickup coils are, for example, 122 channels disposed around a living body. The number of the SQUIDs also is the same.

On one hand, the determining element will receive, through the SQUIDs, data of magnetic flux at the positions of the pickup coils and will be able to calculate the positions of magnetic sources using the data of magnetic flux.

One of the prior methods of calculating the positions of magnetic sources is to draw a distribution map of magnetic fields on the basis of data of magnetic flux picked up through a plurality of pickup coils and to estimate the positions of magnetic sources on the distribution map.

One method on the distribution maps is shown in FIG. 17. In this Figure, a magnetic source (i.e., current dipole) can be estimated to be positioned at the middle point on the line (distance=L) connecting the two peak positions of opposite polarities N and S depicted thereon. The depth of the source may be estimated to be $L/2^{\frac{1}{2}}$ at the middle point.

In case that positions of sources are estimated on the distribution map, differences in positions and sizes of pickup coils sometimes causes an error called "local minimum".

Yet another method is to use a performance function. In other words, the positions of magnetic sources is assumed first, then determined is a performance function between the magnetic field distribution due to the magnetic sources at the assumed positions and the magnetic field distribution measured. Then the positions, size and direction of magnetic sources is decided such that the least square error of the performance function be minimized.

However, as measuring for magnetic sources in a patient's head, a plurality of nerve pulse currents, which work as a plurality of sources, extensively exists and each generate magnetic flux. The plurality of sources and their extension make the above estimation methods extremely difficult, because of complex calculation, leading to a large amount of calculation time.

Further, in a conventionally used measuring apparatus, a plurality of pickup coils was arranged so that their axial directions are parallel with each other. It is possible for pickup coils to detect magnetic flux passing them along their axial directions. But, when the direction of currents is the same as the axial direction of pickup coils, it is impossible to measure the positions of magnetic sources.

In addition, as shown in FIG. 18, the axial direction of a pickup coil 2 is aligned with a direction along the depth of an object 1 being examined. Thus, the deeper the magnetic source, the closer the direction of generated magnetic flux to a direction perpendicular to the axial direction; that is, a direction that will decrease measurement sensitivity of the pickup coil 2.

As apparent from the above, the conventional measuring apparatus has a limit in measurable depth; for example, for a head, its shallow portion such as a brain cortex was measurable, while its deep portion such as thaiamuses and so on was immeasurable.

SUMMARY OF THE INVENTION

Accordingly, it is a primary object of the present invention to provide an apparatus for measuring magnetic sources which is able to measure the data from a plurality of magnetic sources three-dimensionally with higher sensitivity and accuracy.

It is a further object of the present invention to measure the data from magnetic sources with less calculation amount and time than a method of using performance functions.

It is a still further object of the present invention to provide the measuring apparatus having improved sensitivity in the depth direction of an object being measured.

It is a still further object of the present invention to provide the measuring apparatus being able to measure magnetic sources even laid in any direction.

It is a still further object of the present invention to avoid an error of local minimum.

It is a still further object of the present invention to decrease the number of magnetic sensors, compared with the conventional apparatus.

These and other objects can be achieved according to the present invention, in one aspect, by providing an apparatus for measuring a magnetic source existing in an object to be examined and producing a magnetic field outside the object, the apparatus comprising an element for detecting the magnetic field, the detecting element having a sensing portion placed in proximity with the object and adapted to incorporate an observing plane consisting of a plurality of sensing blocks each containing at least three sensing planes on which a magnetic sensor is each mounted, normal directions of the sensing planes being different with each other, an element for evaluating three-dimensionally an intensity of another magnetic field at a given evaluation position on the basis of a value of the magnetic field by the detecting element, and an element for obtaining data of the magnetic source on the basis of the intensity of the another magnetic field evaluated by the evaluating element.

Preferably, the object is a body of a human patient in which a depth direction is specified and the magnetic source is a plurality of current dipoles in the body.

It is preferred that the sensing planes of the sensing blocks be coupled at their sides with each other to form an approximate pyramid and the plurality of sensing blocks are coupled with each other to form the observing plane facing the object, the observing plane having a two-dimensional uneven shape containing a plurality of apexes made by coupling the sides of the sensing planes.

Preferably, the sensing planes contained in each of the sensing blocks is three or four in number. Each of the sensing planes is square or triangular in shape. The pyramid is an approximate inverted triangular pyramid, an approximate inverted quadrangular pyramid, or a quadrangular pyramid, each to the object.

It is also preferred that the observing plane is formed by one base plate. Preferably, the magnetic sensor is a pickup coil sensing inductively the magnetic field produced by the current dipoles. Preferably, the sensing portion includes a superconducting quantum interference device to receive a signal picked up by the pickup coil, the superconducting quantum interference device forming a magnetometer. It is preferred that the magnetic sensor is a superconducting quantum interference device.

Further, it is preferred that the obtaining element comprises an element for specifying assumed positions of the current dipoles in a given three-dimensional region of the body, an element for determining a relational expression between each directional component of the current dipole at each of the assumed positions and each directional component of the other magnetic fields produced at the evaluation position, and an element for calculating each of the directional components of the current dipoles at the assumed positions on the basis of the intensity of the other magnetic fields by the evaluating element and the relational expression.

Preferably, the evaluation position consists of a plurality of intersections of the ends of the sides of the sensing planes. The intersections are the apex, for example. The evaluating element includes a mechanism for evaluating the intensity of the other magnetic fields, at least two of the intersections using the same magnetic field detected from the same sensing plane by the detecting element.

It is further preferred that the observing plane is formed by a plurality of base plates piled in the depth direction. Preferably, measurement sensitivity of the magnetic sensors mounted on the sensing planes of the plurality of base plates are changed every base plate.

It is further preferred that the observing plane is curved in conformity to a curvature of a surface of the body.

Preferably, the single magnetic sensor is mounted on each of the sensing planes or a plurality of the magnetic sensors are mounted on each of the sensing planes.

BRIEF DESCRIPTION OF THE DRAWINGS

The accompanying drawings which are incorporated in and constitute a part of this specification, illustrate embodiments of the present invention and, together with the description, serve to explain the principles of the present invention. In the drawings:

FIG. 9 shows a curved sensing portion of a second embodiment of the present invention;

FIG. 10 shows a sensing portion of a third embodiment of the present invention;

FIG. 11 is a view showing a further variation of a sensing portion of the present invention;

FIG. 12 shows a sensing portion of a fourth embodiment of the present invention;

FIG. 15 is a flowchart carried out by a computer in the fifth embodiment;

DESCRIPTION OF THE PREFERRED EMBODIMENTS

A first embodiment of the present invention will now be described with reference to FIGS. 1 to 7.

Figure 1:
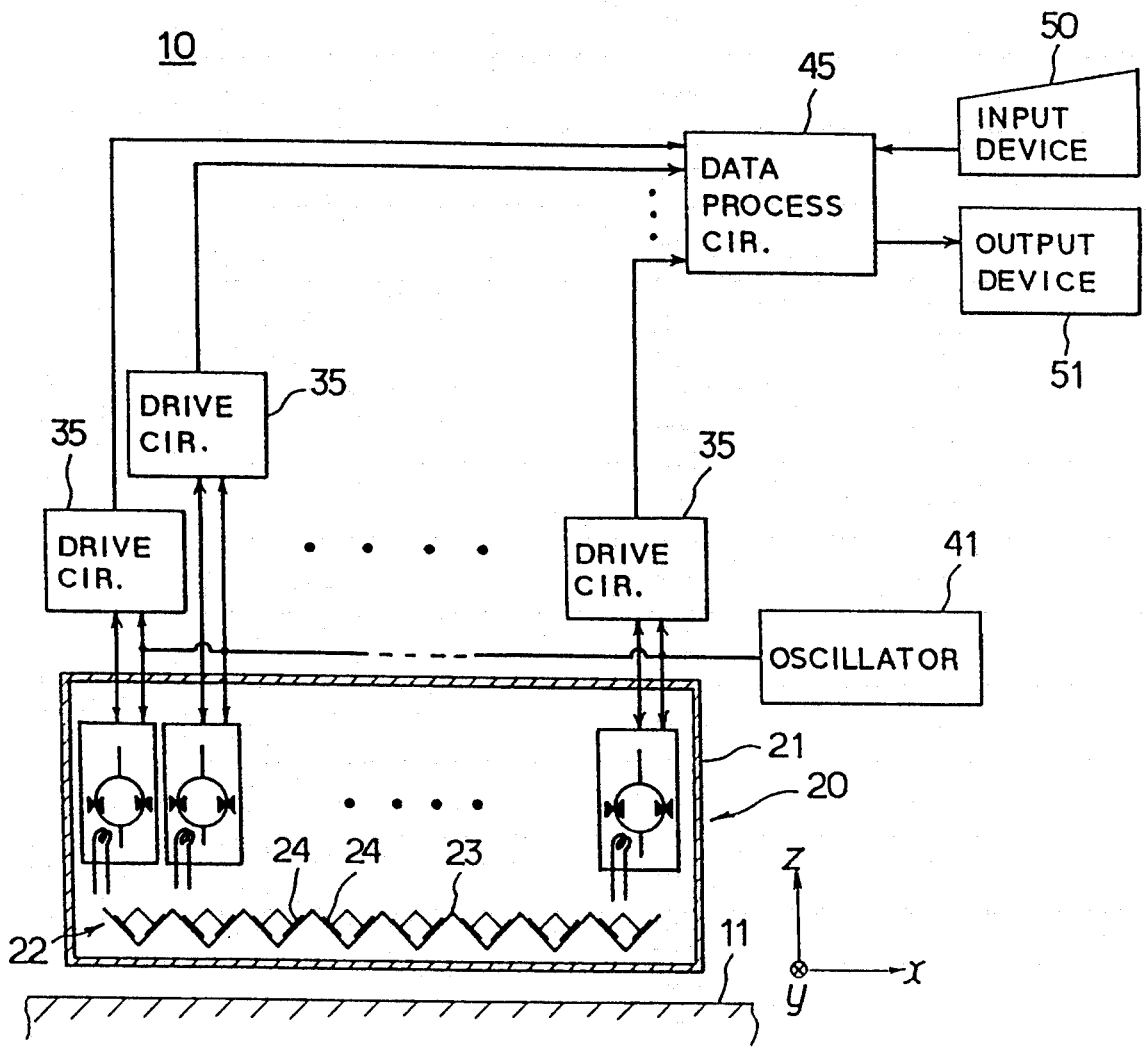
FIG. 1 is a block diagram showing a measuring apparatus of a first embodiment of the present invention.

In FIG. 1, there is provided an apparatus 10 for measuring magnetic sources according to the first embodiment. The measuring apparatus 10 is for the measurement of biomagnetic sources in a human body 11 as an object being examined. A rectangular coordinate system (x-,y-,z-axes) are now set as illustrated in FIG. 1, and in this case, the x-y plane (hereinafter, called a measuring plane) is assigned to the surface of the body 11.

The measuring apparatus 10 comprises a detecting unit 20 for detecting magnetic fields produced from biomagnetic sources, that is, current dipoles in the body 11. The detecting unit 20 is contained within a liquid helium cryostat 21 to be operated in a cryogenic temperature.

In the detecting unit 20, there is a sensing portion 22 having a substrate 23 as a base plate of the present invention. The substrate 23 is made from a printed circuit board and formed into a uneven shape having a chopping-wavelike cross section. In addition, it is possible to use a glass-made plate or ceramic-made plate as the base plate. As a whole, the substrate 23 is placed to face the x-y measuring plane.

Figure 2A:
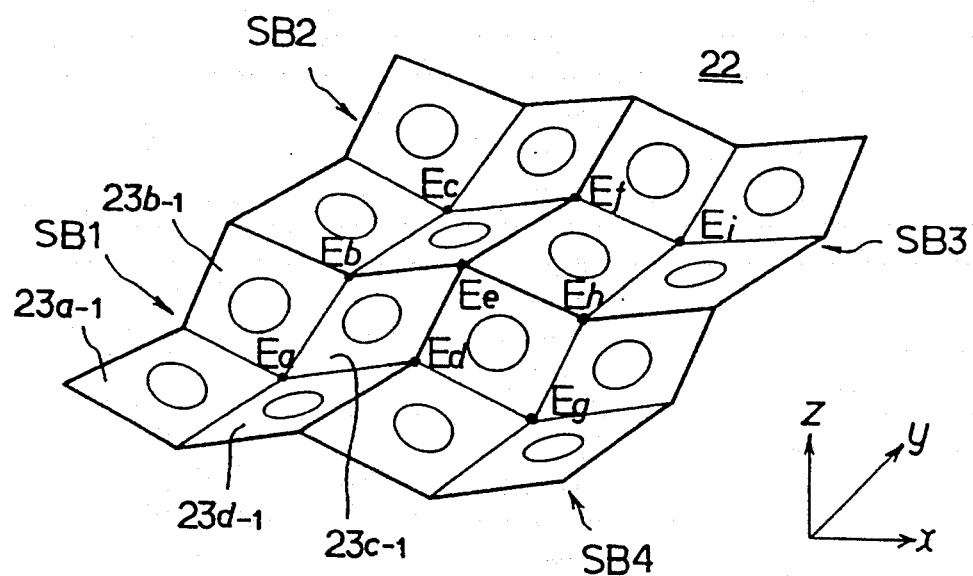
FIG. 2A is a perspective view of a sensing portion of the measuring apparatus of the first embodiment.
Figure 2B:
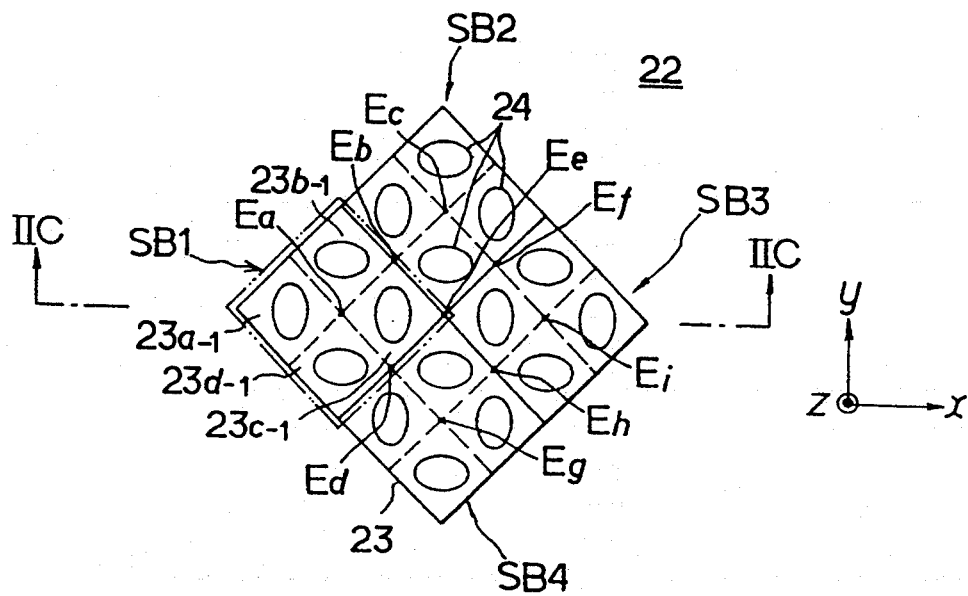
FIG. 2B is a plan view of the sensing portion.
Figure 2C:
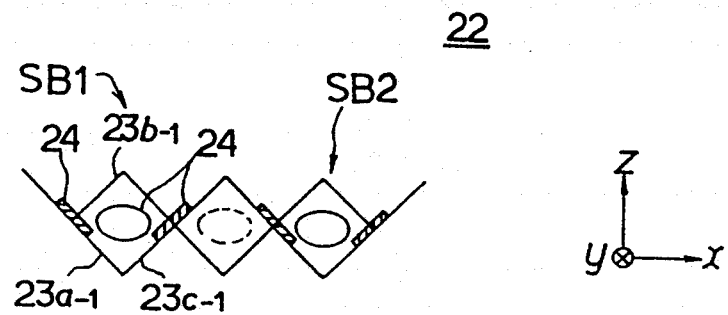
FIG. 2C is a cross-sectional view taken along a line IIC—IIC in FIG. 2B.

In detail, as shown in FIGS. 2A to 2C, the substrate 23 regularly and continuously undulates to have a chopping-wave cross section in two x- and y-axes directions perpendicular to each other. As a result, at the upper side (a side behind the body 11) of the substrate 23, which forms an observing plane of the present invention, a plurality of oblique and square sensing planes 23a-1,23b-1, ..., 23c-4,23d-4 are made by the undulation. The sensing planes 23a-1,23b-1, ..., 23c-4,23d-4 are divided into four groups in this embodiment, namely, four sensing blocks SB1 to SB4.

In one sensing block SB1 made from four square sensing planes 23a-1,23b-1,23c-1,23d-1, one pair of 23a-1 and 23c-1 is faced to each other at a certain elevation angle therebetween and the other pair of 23b-1 and 23d-1 is also faced to each other at the same elevation angle therebetween. As a whole, the sensing planes 23a-1,23b-1,23c-1,23d-1 are combined to form an approximate inverted quadrangular pyramid. The remaining three sensing blocks 502 to SB4 are the same in construction as the above.

On the four sensing blocks SB1 to 504, there are nine intersections Ea to Ei at which the sides of four adjacent sensing planes are crossed. These intersections Ea to Ei are evaluation positions for magnetic fields, which will be described later.

On all the sensing planes 23a-1,23b-1, ..., 23c-4,23d-4, a pickup coil 24 is mounted individually. Thus, each of the sensing blocks 501 to 504 has four pickup coils 24 ... 24 obliquely faced to each other in two x- and y-directions. The pickup coil 24 is formed by a thin film coil of superconducting materials. It is preferred that the pickup coil 24 be mounted by means of sputtering or vapor deposition technique with materials such as NbTi. However, the present invention is not so limited, and may use a magnetometer or gradiometer produced from a superconducting wire. In case of the magnetometer being used as a pickup coil, it is desirable to use a magnetic shield for shielding the measuring apparatus from the environmental magnetic fields.

Further, in the detection unit 20, each of the pickup coils 24 ... 24 is magnetically coupled with a superconducting quantum interference device 25 (SQUID) respectively. That is, each of the SQUIDs 25 ... 25 are disposed for each of as the pickup coils 24 ... 24 thereon.

Figure 3:
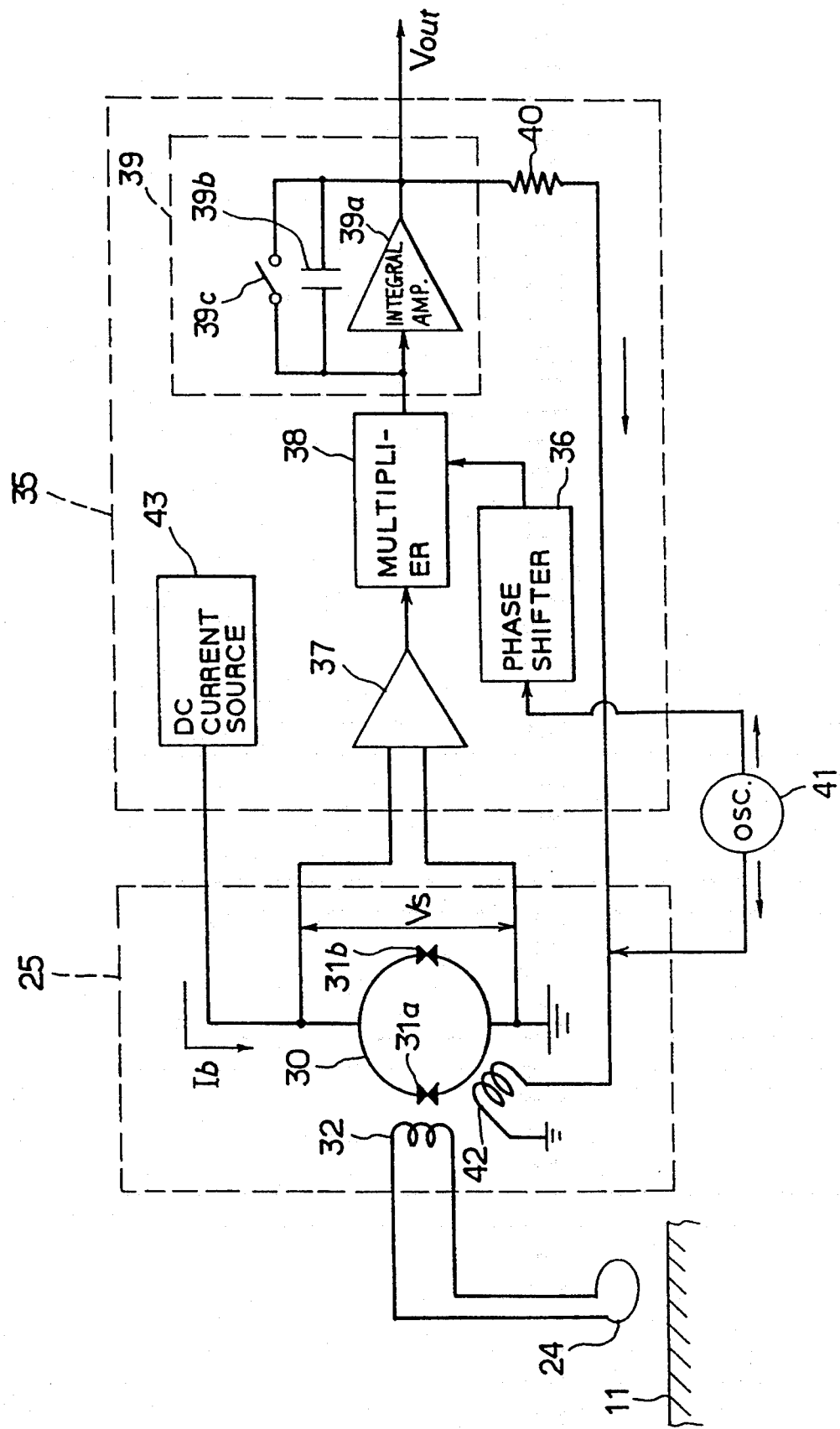
FIG. 3 is a block diagram showing a SQUID and a drive circuit.

The SQUID 25 is, in this embodiment, DC type, as shown in FIG. 3. The DC type of SQUID 25 has a superconducting ring 30 including two Josephson junctions 31a and 31b in the way and receiving a DC bias current Ib for operation. A magnetic flux sensed at the pickup coil 24 is given to the SQUID 25 via an input coil 32. The SQUIDs 25 ... 25, together with the foregoing sensing portion 22, are immersed in liquid helium in the cryostat 21, with the result that they are maintained at a temperature of 4.2[°K] therein.

As a result, the SQUID 25 will generate a voltage signal Vs at its output terminals, the voltage signal Vs being varied as the strength of the magnetic fluxes sensed at the pickup coil 24.

The outputs Vs ... Vs of the SQUIDs 25 ... 25 are then supplied to a plurality of drive circuits 35 ... 35, respectively, which are provided outside the cryostat 21. Each of the drive circuits 35 ... 35 is constructed to operate on a mode known as "flux locked loop (FLL) operation". That is, as shown in FIG. 3, there is provided a phase shifter 36, a pre-amplifier 37, a multiplier 38, an integrator 39 (formed by an integral amplifier 39a, an integral capacitor 39b and an integrator switch 39c), and a feedback resistor 40. An oscillator 41 is provided to send a modulation signal for signal detection to the SQUIDs 25 ... 25 and to a reference signal to the drive circuits 35 ... 35. The modulation signal is applied to the superconducting ring 30 via a modulation feedback coil 42 in the SQUID 25.

Also included in each of the drive circuits 35 is a DC current source 43 for supplying the foregoing DC bias current Ib to the SQUIDs 25, respectively.

The flux locked loop operation will enable the drive circuits 35 ... 35 to output a voltage signal Vout, which is proportional to the strength of the magnetic fluxes sensed at the pickup coil 24. The voltage signals Vout . .. Vout thus-obtained are supplied to a data process circuit 45.

Figure 4:
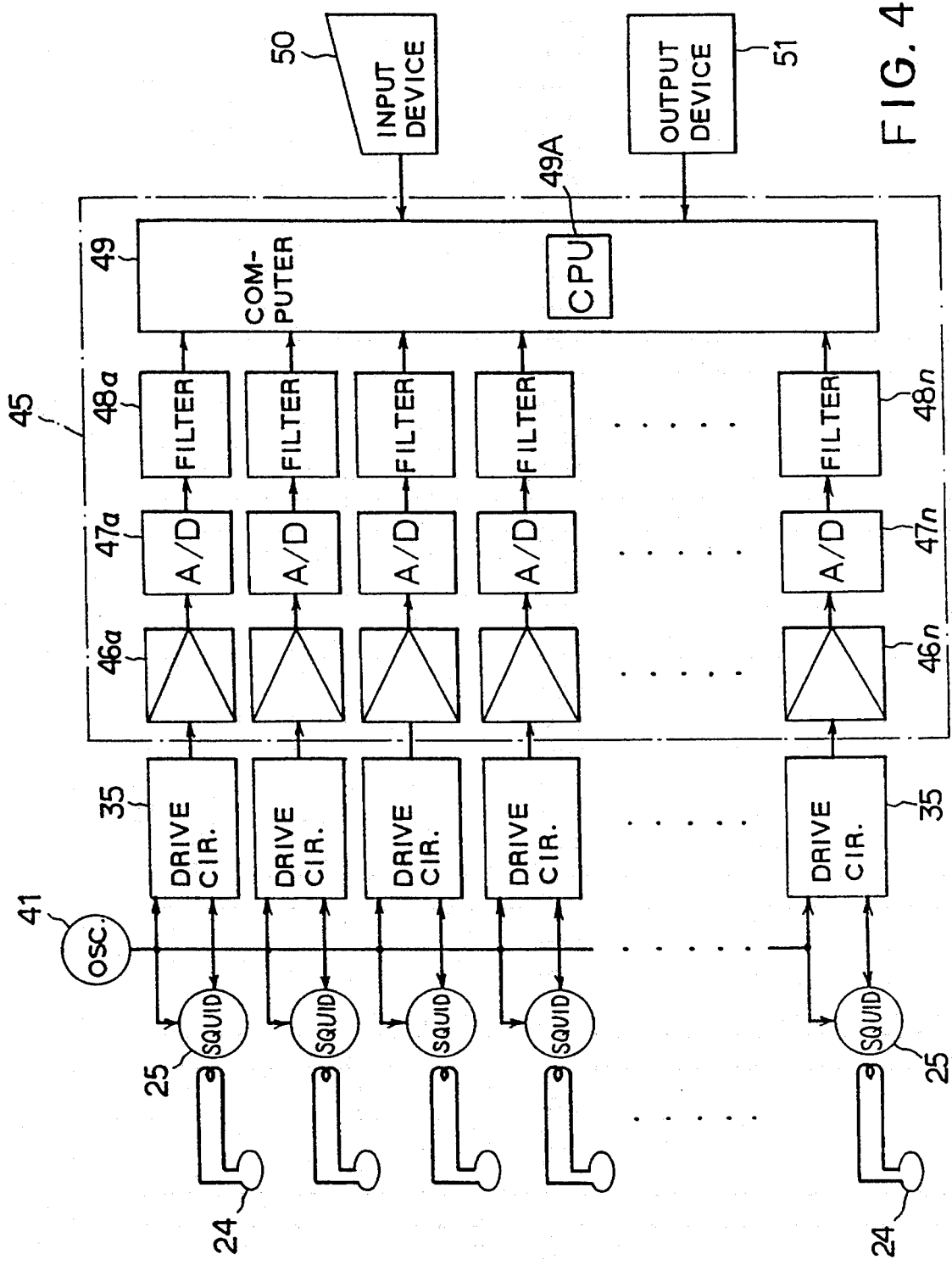
FIG. 4 is a block diagram showing a data process circuit.

The data process circuit 45 comprises, as shown in FIG. 4, amplifiers 46a ... 46n, analog to digital converters 47a ... 47n, filters 48a ... 48n and a computer 49. The amplifiers 46a ... 46n, analog to digital converters 47a ... 47n, and filters 48a ... 48n are arranged correspondingly one by one to the SQUIDs 25 ... 25. Thus, each Vout signal is sent, via an amplifier 46a( ... 46n), an analog to digital converter 47a( ... 47n), and a filter 48a( ... 48n), to the computer 49. Connected to the computer 49 is an input device 50 such as a key board and an output device such as a CRT (cathode-ray tube).

The foregoing computer 49 is provided with a CPU (central processing unit) 49A to calculate, on the basis of the input Vout signals, the positions and magnitudes of current dipoles in a human body 11. This calculation should be done generally by two stages; one is for estimation of magnetic fields at given evaluation positions on the obtained voltage signals Vout ... Vout, the other for calculation of the magnitudes and determination of the positions using the estimation results.

In this embodiment, the detecting unit 20 and the drive circuits 35 ... 35 form the detecting means of the present invention and the data process circuit 45 forms the evaluating and obtaining means of the present invention.

Figure 5:
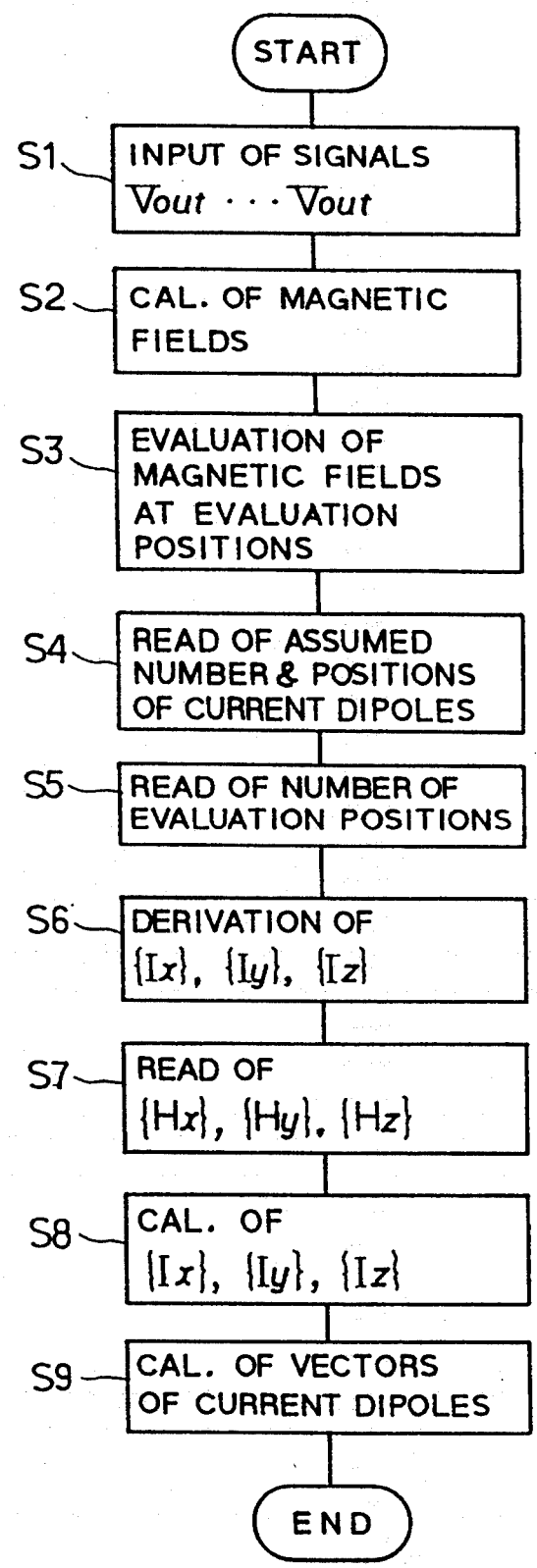
FIG. 5 is a flowchart carried out by a computer in the first embodiment.

In order to achieve the above calculation, the CPU 49A of the computer 49 will carry out processing shown in FIG. 5, the processing being predetermined and stored in its memory (not shown) In FIG. 5, the processing of Steps S1 to S3 corresponds to the evaluating means of the present invention and the processing of Steps S4 to S9 corresponds to the obtaining means of the present invention.

For measurement, the detecting unit 20 is disposed in proximity with the surface of the body 11. In case that the body 11 is the head, for example, the disposition of the detecting unit 20 is adjusted such that its z-axis is directed along the radial direction of the head (that is, a direction going from its inner center to its surface). The sensing portion 22 including the pickup coils 24 ... 24 and the SQUIDs 25 ... 25 are cooled down to a temperature of approximately 4.2° K for maintaining their superconducting states.

Such preparation allows the pickup coils 24 ... 24 to magnetically pick up magnetic fluxes which emanate from current dipoles in the body 11 to be examined. When the magnetic fluxes are picked up, the SQUIDs 25 ... 25 receiving the picked-up magnetic signals will send voltage signals Vs ... Vs, which changes with the magnetic fluxes, to the drive circuits 35 ... 35, respectively. Therefore, from the drive circuits 35 ... 35, the voltage signals Vout ... Vout proportional to the intensities of the magnetic fluxes will be sent to the computer 49. This detection will be performed independently at every pickup coil 24.

In parallel with such detection, the processing of FIG. 5 will be carried out by the CPU 49A of the computer 49.

At Step S1 of FIG. 5, the CPU 49A receives voltage signals Vout ... Vout from the drive circuits 35 ... 35, via amplifiers 46a ... 46n, analog to digital converters 47a ... 47n, and filters 48a ... 48n.

Then at Step S2, on the basis of the inputted voltage signals Vout ... Vout corresponding to the intensities of magnetic fluxes at the pickup coils 24 ... 24, their magnetic flux densities are each calculated by dividing the intensities of magnetic fluxes by the flux-reception areas of the pickup coils 24 ... 24. The calculated magnetic flux densities B ... B are then converted into the intensities of magnetic fields H ... H according to $B = \mu H$ ($\mu$: permeability).

Then at Step S3, using the intensities of magnetic fields thus-calculated, the intensities of magnetic fields at predetermined evaluation positions will be three-dimensionally evaluated. The detailed way of this evaluation is as follows.

Figure 6:
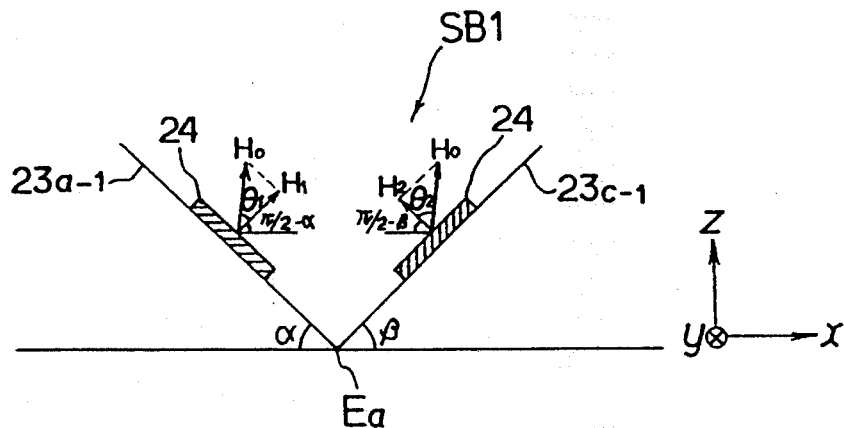
FIG. 6 represents a geometric relation of a sensing block in an orthogonal coordinate system.

FIG. 6 exemplifies the correlation between the magnetic fields $H_1$ and $H_2$ at sensing planes 23a-1 and 23c-1 and their picked up positions toward the x-y measuring plane. In FIG. 6, an evaluation position is assigned at an intersection Ea at which the sides of four sensing planes 23a-1, 23b-1, 23c-1, 23d-1 cross; that is, the evaluation position Ea is the center of one sensing block SB1. There are angles $\alpha$ and $\beta$ between the sensing planes 23a-1 and 23c-1 and the x-y measuring plane, respectively.

The pickup coil 24 is able to pick up only the normal component of a magnetic field $H_0$ passing through the coil 24. But in general the magnetic field $H_0$ makes a certain angle to the normal direction of the pickup coil 24. Such angles at the pickup coils 24 and 24 on the sensing planes 23a-1 and 23c-1 are each $\theta_1$ and $\theta_2$, as shown in FIG. 6. The normal components of the magnetic fields $H_0$, $H_0$ at the sensing planes 23a-1 and 23c-1 have been calculated as $H_1$ and $H_2$ at the foregoing processing of Step S2. Hence, as shown in FIG. 6, the angle of $\theta_1$ exists between $H_0$ and $H_1$ and the angle of $\theta_2$ between $H_0$ and $H_2$.

Therefore, at the given evaluation position Ea, the magnetic component $H_x$ of $H_0$ in x-direction and the magnetic component $H_z$ of $H_0$ in z-direction are expressed and evaluated using the known $\alpha$, $\beta$, $H_1$ and $H_2$.

The same evaluation technique is applied to the remaining pair of the sensing planes 23b-1 and 23d-1, so that the magnetic components $H_y$ and $H_z$ in y- and z-directions at the same evaluation position Ea are calculated. Thus all of the components $H_x$, $H_y$ and $H_z$ of $H_0$ can be determined at the evaluation position Ea.

Further, for the remaining evaluation positions Eb to Ei assigned (refer to FIG. 25), the same calculation will be carried out, thus the three components $H_x$, $H_y$ and $H_z$ of $H_0$ are determined each at those positions Eb to Ei.

Next at Step S4, the CPU 49A will take in the assumed number and positions of current dipoles within the body 11. For example, it is assumed that the number is n (integer greater than 1) in a three-dimensional region of brain cortex in the patient head.

At Step S5, the CPU 49A will then take in the number and the three dimensional position of the evaluation positions that were predetermined. For example, the number m of the evaluation positions are, as shown in FIG. 20, nine of Ea to Ei. As the distance between the pickup coils 24 and 24 has a certain minimum, it is sometimes difficult to dispose as much pickup coils as current dipoles. In such a case, it is possible to increase evaluation positions using known a interpolation technique.

Then at Step S6, the CPU 49A will derive equations of $\{I_x\}$, $\{I_y\}$ and $\{I_z\}$ which represent the correlation between directional components of each current dipole at each assumed position and directional components of each magnetic field produced at each evaluation position by the directional components of each current dipole.

The derivation of the equations of $\{I_x\}$, $\{I_y\}$ and $\{I_z\}$ will now be explained according to FIG. 7 as follows.

Figure 7:
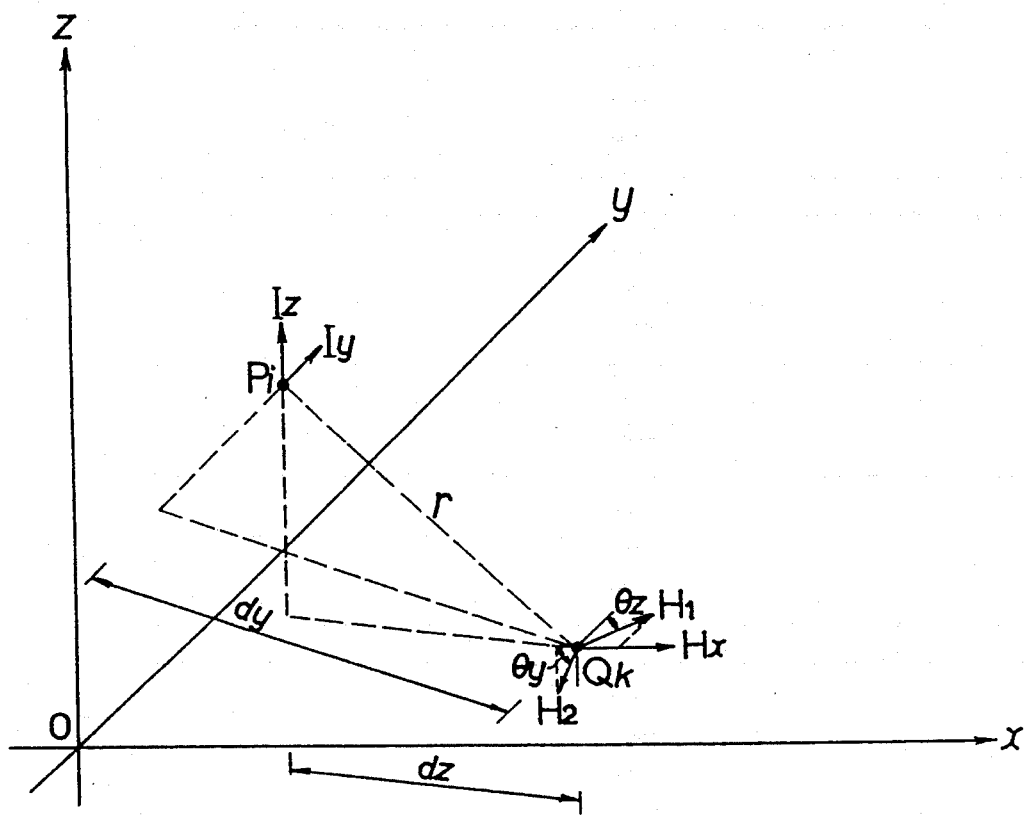
FIG. 7 represents a geometric relation of a current dipole and its magnetic field.

First, as shown in FIG. 7, assume that an assumed position of a current dipole is $P_i$ and an evaluation position is $Q_k$ in the three-dimensional orthogonal coordinate system. Under such a situation, magnetic fields $H_x$, $H_y$, and $H_z$, produced at the position $Q_k$ by components $I_x$, $I_y$, and $I_z$ of a current dipole exists at the position $P_i$, are to be obtained.

FIG. 7 illustrates obtaining a magnetic component $H_x$ at the position $Q_k$ produced by components $I_y$ and $I_z$ of a current dipole at the position $P_i$. A current component $I_x$ does not contribute to the magnetic component $H_x$, so $I_x$ is not taken into account here.

According to Biot-Savart's law, the magnetic component $H_x$ due to the current components $I_y$ and $I_z$ at the assumed position $P_i$ is given by $$H_x = (I_y/4\pi r^2)(d_y/r)\cos\theta_y + (I_z/4\pi r^2)(d_z/r)\sin\theta_z \quad (1)$$

When placing that $$\begin{aligned} g_{xy} &= (1/4\pi r^2)(d_y/r)\cos\theta_y \\ g_{xz} &= (1/4\pi r^2)(d_z/r)\sin\theta_z \end{aligned} \quad (2)$$

gives the result of $$H_x = g_{xy}I_y + g_{xz}I_z \quad (3)$$

Next, for all the current dipoles and the evaluation positions, $g_{xy}$ and $g_{xz}$ are also determined and then their matrices $[G_{xy}]$ and $[G_{xz}]$ are formed.

Therefore, the intensity of magnetic field $\{H_x\}$ in the x-directional component produced at m-pieces evaluation positions by the y- and z-directional components $\{I_y\}$ and $\{I_z\}$ of n-pieces current dipoles is as follows.

$$\{H_x\} = [G_{xy}]\{I_y\} + [G_{xz}]\{I_z\} \quad (4)$$

Also by the same way, $[G_{xy}]$, $[G_{xz}]$, $[G_{yx}]$, $[G_{yz}]$, $[G_{zx}]$ and $[G_{zy}]$ are formed. Thus the following equations are given.

$$\{H_y\} = [G_{xy}]\{I_x\} + [G_{yz}]\{I_z\} \quad (5)$$

$$\{H_z\} = [G_{zx}]\{I_x\} + [G_{zy}]\{I_y\} \quad (6)$$

Next, using the above three equations (4) to (6), a relational expression in which $\{I_x\}$, $\{I_y\}$ and $\{I_z\}$ are calculated on $[G_{xy}]$, $[G_{xz}]$, $[G_{yx}]$, $[G_{yz}]$, $[G_{zx}]$ and $[G_{zy}]$ and $H_x$, $H_y$ and $H_z$ is formed as follows $$\{I_x\} = \tag{7}$$

$$[A]_x^{-1}([G_{xy}]^{-1}[G_{xz}] \ [G_{yz}]^{-1}\{H_y\} + [G_{zy}]^{-1}\{H_z\} - [G_{xy}]^{-1}\{H_x\})$$

where $$[A]_x = [G_{xy}]^{-1}[G_{xz}][G_{yz}]^{-1}[G_{yx}] + [G_{zy}]^{-1}[G_{zx}] \tag{8}$$

The same relational expression for $\{I_y\}$ and $\{I_z\}$ can also be obtained.

Back to the processing of FIG. 5, at Step S7, $\{H_x\}$, $\{H_y\}$ and $\{H_z\}$ evaluated at Step S3 are taken into the CPU 49A from its internal memory. Then at Step 88, $\{H_x\}$, $\{H_y\}$ and $\{H_z\}$ are put into the equation (7) to calculate $\{I_x\}$. In the same way, $\{H_x\}$, $[H_y]$ and $\{H_z\}$ are put into the equations (not shown) to calculate $\{I_y\}$ and $\{I_z\}$. $\{I_x\}$, $\{I_y\}$ and $\{I_z\}$ thus-obtained represent each directional component of the current dipoles.

Then at Step 89, based on $\{I_x\}$, $\{I_y\}$ and $\{I_z\}$ thus-obtained, the vector current of each current dipole is calculated by vector synthesis.

As explained above, $\{I_x\}$, $\{I_y\}$ and $\{I_z\}$ are the current components of the current dipoles at the assumed spatial positions within the body 11. But, if a current dipole actually does not exist at an assumed position, the current components at the position become approximately zero, whereas the current components having some values will appear at positions where current dipoles exist. Therefore, increasing the number of current dipoles assumed in the body 11 or adjusting the distribution of current dipoles allow the measuring apparatus 10 to measure, with enough accuracy, the three-dimensional positions of current dipoles which truly exist therein.

In the measuring apparatus of the present embodiment, a plurality of pickup coils 24 . . . 24 are disposed against the x-y observing plane, with an elevation angle to each other. This disposition makes it possible to three-dimensionally evaluate magnetic fluxes generated from magnetic sources within a body.

In contrast, as explained before, the conventional measuring apparatus detected only magnetic fluxes along the normal z-direction at the x-y measuring plane and focused primarily on current dipoles parallel to the x-y measuring plane. But the measuring apparatus of the present embodiment enables the detection of magnetic fluxes from current dipoles directed in any direction.

Further, magnetic fluxes picked up by the SQUIDs 25 . . . 25 are used for the evaluation of magnetic fields at a plurality of evaluation positions. As apparent from the FIG. 20, when the pickup coils 24 . . . 24 is "N×N" in number (N:integer greater than 2), it is possible to evaluate it at the positions of "(N−1)×(N−1)", resulting in a higher density of evaluation for the same number of pickup coils as in the conventional apparatus.

In regard to the number of pickup coils disposed, the present invention is not limited to the "4×4" shown in FIGS. 2A to 2C. It is possible to have an appropriate disposition number of pickup coils in conjunction with the desired detection channel numbers.

In the present measuring apparatus, the positions of current dipoles are first assumed, then the relational expressions between each of the assumed current dipoles and the three-dimensional magnetic field intensities at the evaluation positions are determined, and then the magnetic field intensities are put into the relational expressions. This procedure of calculation makes it possible to acquire every component of the magnitudes of current dipoles at the assumed positions. Hence, this enables one to specify the positions and directions of a plurality of current dipoles with less calculation time and amount for a plurality of current dipoles.

Further, as the pickup coils 24 . . . 24 are disposed obliquely to the x-y measuring plane, even if the same coil diameter as the conventional one is used, the measurement sensitivity of the magnetic source position in the (depth) z-direction is greatly enhanced.

The drive circuit 35 of the present embodiment is constructed using a circuit called "Ketchen Type". Instead of this circuit, it is possible to use drive circuits, such as "Drung type" with no modulation feedback, either in the form of "relaxation oscillated type", or "digital type".

In addition, the detecting unit 20 of the present embodiment may omit the pickup coils 24 . . . 24, the SQUIDs 25 . . . 25 being constructed so as to directly detect the magnetic flux generated from current dipoles. In such a case, the SQUIDs 25 . . . 25 will be disposed with the same construction as the foregoing pickup coils 24 . . . 24, and the signals detected by the SQUIDs 25 . . . 25 will be used for the three-dimensional evaluation of magnetic fields at given evaluation positions, and the evaluated magnetic fields will then be used for the measurement of the positions of the magnetic sources.

Figure 8:
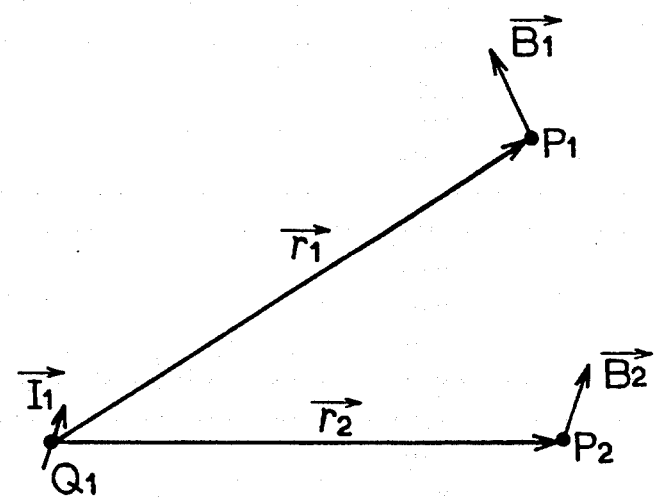
FIG. 8 is a geometric relation of a current dipole and its magnetic field as exploited by the present invention.

Now, to make clear the relation between current dipoles and their magnetic fields, which gives foundation to the algorithm of the present invention, it is shown as follows that a current dipole expressed by $I_1$ ($I_{x1}$, $I_{y1}$, $I_{z1}$) in FIG. 8 is able to be solved as a general solution. In FIG. 8, two position vectors at two measuring points $P_1$ and $P_2$ are expressed by $r1=(r_{x1}, r_{y1}, r_{z1})$ and $r2=(r_{x2}, r_{y2}, r_{z2})$ in respect to x-, y- and z-axes (not shown).

When magnetic fields $B_1$ and $B_2$, produced by a current dipole $I_1$ ($I_{x1}$, $I_{y1}$, $I_{z1}$) at a position $Q_1$, are measured at positions $P_1$ and $P_2$, the relation between $I_1$ and $B_1$ ($B_{x1}$, $B_{y1}$, $B_{z1}$), $B_2$ ($B_{x2}$, $B_{y2}$, $B_{z2}$) are expressed by the following expressions (9) and (10):

$$\begin{bmatrix} B_{x1} \\ B_{y1} \\ B_{z1} \end{bmatrix} = K_1 \begin{bmatrix} 0 & r_{z1} & -r_{y1} \\ -r_{z1} & 0 & r_{x1} \\ r_{y1} & -r_{x1} & 0 \end{bmatrix} \begin{bmatrix} I_{x1} \\ I_{y1} \\ I_{z1} \end{bmatrix} = K_1[R_1][I_1] \tag{9}$$

$$\begin{bmatrix} B_{x2} \\ B_{y2} \\ B_{z2} \end{bmatrix} = K_2 \begin{bmatrix} 0 & r_{z2} & -r_{y2} \\ -r_{z2} & 0 & r_{x2} \\ r_{y2} & -r_{x2} & 0 \end{bmatrix} \begin{bmatrix} I_{x1} \\ I_{y1} \\ I_{z1} \end{bmatrix} = K_2[R_2][I_2] \tag{10}$$

where $[R_1]$, $[R_2]$ are matrices determined by the geometric relation in the expressions (9) and (10) and $K_1$ and $K_2$ are constants.

Generally, when $[R_1]$ in the expression (9) is $$[R_1] = \begin{bmatrix} 0 & r_{z1} & -r_{y1} \\ -r_{z1} & 0 & r_{x1} \\ r_{y1} & -r_{x1} & 0 \end{bmatrix} \tag{11}$$

the determinant of $[R_1]$ is $$|R_1| = 0 \tag{12}$$

and [R₁] does not have its inverse matrix. This means that $I_1$ ($I_{x1}$, $I_{y1}$, $I_{z1}$) does not have a general solution.

However, using each element of [R₁], [R₂] in the expressions (9) and (10) enables $I_1$ ($I_{x1}$, $I_{y1}$, $I_{z1}$) to have a general solution.

For example, the relation between [I₁] and [B'] = B'($B_{x1}$, $B_{y1}$, $B_{y2}$) can be represented as follows:

$$\begin{bmatrix} B_{x1} \\ B_{y1} \\ B_{y2} \end{bmatrix} = K_1 \begin{bmatrix} 0 & K_1 r_{z1} & -K_1 r_{y1} \\ -K_1 r_{z1} & 0 & K_1 r_{x1} \\ -K_2 r_{z2} & 0 & K_2 r_{x2} \end{bmatrix} \begin{bmatrix} I_{x1} \\ I_{y1} \\ I_{z1} \end{bmatrix} \quad (13)$$

In other words, $$\begin{vmatrix} 0 & K_1 r_{z1} & -K_1 r_{y1} \\ -K_1 r_{z1} & 0 & K_1 r_{x1} \\ -K_2 r_{z2} & 0 & K_2 r_{x2} \end{vmatrix} = K_1^2 K_2 r_{z1} r_{x1} (r_{z1} - r_{z2}) \quad (14)$$

Therefore, the matrix [R'], which is $$\begin{bmatrix} 0 & K_1 r_{z1} & -K_1 r_{y1} \\ -K_1 r_{z1} & 0 & K_1 r_{x1} \\ -K_2 r_{z2} & 0 & K_2 r_{x2} \end{bmatrix} = [R'] \quad (15)$$

is able to have its inverse matrix, when $r_{z1}$ is not equal to $r_{z2}$.

The following shows a more practical example. When $$\begin{bmatrix} I_{x1} \\ I_{y1} \\ I_{z1} \end{bmatrix} = \begin{bmatrix} 1 \\ -2 \\ 3 \end{bmatrix}, \quad (16)$$

$$\begin{bmatrix} r_{x1} \\ r_{y1} \\ r_{z1} \end{bmatrix} = \begin{bmatrix} 1 \\ 1 \\ 1 \end{bmatrix}, \quad (17)$$

$$\begin{bmatrix} r_{x2} \\ r_{y2} \\ r_{z2} \end{bmatrix} = \begin{bmatrix} 1 \\ 1 \\ -1 \end{bmatrix}, \quad (18)$$

$B_1$ ($B_{x1}$, $B_{y1}$, $B_{z1}$) and $B_2$ ($B_{x2}$, $B_{y2}$, $B_{z2}$) are $$\begin{bmatrix} B_{x1} \\ B_{y1} \\ B_{z1} \end{bmatrix} = K_1 \begin{bmatrix} 0 & 1 & -1 \\ -1 & 0 & 1 \\ 1 & -1 & 0 \end{bmatrix} \begin{bmatrix} 1 \\ -2 \\ 3 \end{bmatrix} = K_1 \begin{bmatrix} -5 \\ 2 \\ 3 \end{bmatrix} \quad (19)$$

$$\begin{bmatrix} B_{x2} \\ B_{y2} \\ B_{z2} \end{bmatrix} = K_2 \begin{bmatrix} 0 & -1 & -1 \\ 1 & 0 & 1 \\ 1 & -1 & 0 \end{bmatrix} \begin{bmatrix} 1 \\ -2 \\ 3 \end{bmatrix} = K_2 \begin{bmatrix} -1 \\ 4 \\ 3 \end{bmatrix} \quad (20)$$

Thus, $$\begin{bmatrix} B_{y2} \\ B_{x1} \\ B_{y1} \end{bmatrix} = K_1 \begin{bmatrix} K_2 & 0 & K_2 \\ 0 & K_1 & -K_1 \\ -K_1 & 0 & K_1 \end{bmatrix} \begin{bmatrix} I_{x1} \\ I_{y1} \\ I_{z1} \end{bmatrix} \quad (21)$$

$$\begin{bmatrix} K_2 & 0 & K_2 \\ 0 & K_1 & -K_1 \\ -K_1 & 0 & K_1 \end{bmatrix}^{-1} = \frac{1}{2K_1 K_2} \begin{bmatrix} K_1 & 0 & -K_2 \\ K_1 & 2K_2 & K_2 \\ K_1 & 0 & K_2 \end{bmatrix} \quad (22)$$

Therefore, $$\frac{1}{2K_1 K_2} \begin{bmatrix} K_1 & 0 & -K_2 \\ K_1 & 2K_2 & K_2 \\ K_1 & 0 & K_2 \end{bmatrix} \begin{bmatrix} 4K_2 \\ -5K_1 \\ 2K_1 \end{bmatrix} = \begin{bmatrix} I_{x1} \\ I_{y1} \\ I_{z1} \end{bmatrix} \quad (23)$$

$$\begin{bmatrix} I_{x1} \\ I_{y1} \\ I_{z1} \end{bmatrix} = \frac{1}{2K_1 K_2} \begin{bmatrix} 2K_1 & K_2 \\ -4K_1 & K_2 \\ 6K_1 & K_2 \end{bmatrix} \begin{bmatrix} 1 \\ -2 \\ 3 \end{bmatrix} \quad (24)$$

Apparently, the resulting values of $I_1$ ($I_{x1}$, $I_{y1}$, $I_{z1}$) in the expression (24) coincide with its given values in the expression (16). This means that the above calculation method is effective in determining the general solution and preferably adopted in the present invention. In the foregoing example, one current dipole was introduced for discussion. Of course, the same calculation method may also be applied to a plurality of current dipoles.

Going back to the present embodiment, instead of superconducting materials, such as NbTi, being used for the pickup coils and the SQUIDs, superconducting materials which become superconductive at a temperature of liquid nitrogen or a cold temperature may also be used. In case of using cold superconducting materials, the cryostat as a cooling container will be simpler in construction.

On the other hand, in the present embodiment, the data process circuit 45 is made in a manner such that matrices correlating each directional component vector of the current dipoles at assumed positions specified within a three-dimensional region of a patient body and each directional component vector of the magnetic field intensities produced at given evaluation positions by each directional component of the current dipoles are determined, and then the matrices and the magnetic field intensities actually evaluated at the given evaluation positions are used to deduce each directional component vector of the current dipoles at the assumed positions. However, for such a calculation, a distribution of lines of magnetic force may be drawn on the evaluated components of intensities of magnetic fields and the distribution may be used for the deduction of positions of current dipoles.

A second embodiment of the present invention will now be described according to FIG. 9.

The sensing portion 22 of the first embodiment have had a flat observing plane as a whole, although the irregularities of chopping-wave in cross section are formed thereon. In contrast, the entire substrate 23 of the second embodiment, with a chopping-wave like shape maintained, may be curved in conformity with the curvature of a surface of a patient body 11, as shown in FIG. 9.

As a result, the sensing portion 22 is fitted adequately to various diagnostic portions of a patient body, the sensitivity for measurement therefore being increased.

A third embodiment of the present invention will now be described according to FIG. 10.

This embodiment relates to a variation of the sensing portion 22. The first embodiment adopts a construction in which a sensing block consists of four square sensing planes and each sensing plane have one pickup coil. But the present invention is not limited to such a construction, and the least and primitive requirement is to have three sensing planes whose three normal directions differ from each other and to mount at least one pickup coil on each of the three sensing planes.

FIG. 10 shows the sensing portion 22 of the third embodiment having a plurality of sensing blocks SB1 to SB4. Each of the sensing blocks SB1 to SB4 is composed of three square sensing planes 61a-1, 61b-1 and 61c-1 ( . . . 61a-4, 61b-4 and 61c-4) orthogonal to each other to form an approximate triangular pyramid, and a pickup coil 24 is mounted on each of the sensing planes 61a-1, 61b-1 and 61c-1 ( . . . 61a-4, 61b-4 and 61c-4). Further, each of the sensing blocks SB1 to SB4 has an evaluation position E1 ( . . . E4) on the apex formed by the three planes 61a-1, 61b-1 and 61c-1 ( . . . 61a-4, 61b-4 and 61c-4). In the figure, dotted lines represent valleys which are edges of inverted triangular pyramids formed among adjacent sensing blocks.

Therefore, using the same method as the first embodiment, the magnetic fields at the evaluation positions E1 to E4 are three-dimensionally calculated on the signals from the three pickup coils 24 . . . 24 in the sensing blocks SB1 ( . . . SB4), respectively. For example, for the evaluation at the position E1, the angles $\alpha$, $\beta$ and $\tau$ (not shown) of the sensing planes 61a-1, 61b-1 and 61c-1 made to the x-y measuring plane, are used and the same calculation procedure as the first embodiment is applied.

On the sensing portion 22, other evaluation positions E5 and E6 are formed at the inverted apexes, as shown in FIG. 10. For these evaluation positions E5 and E6, the magnetic fields are three-dimensionally calculated by the signals from three pickup coils 24 . . . 24 on the adjacent three (or more) sensing planes. In detail, the three pickup coils 24 . . . 24 on the three sensing planes 61c-1, 61b2 and 61a-4 are used for the evaluation position E5 and the six pickup coils 24 . . . 24 on the six sensing planes 61b-2, 61c-2, 61a-3, 61c-3, 61c-4 and 61a-4 for the evaluation position E6.

As another variation of the sensing portion 22, it is also possible to adopt a construction shown in FIG. 11. In this variation, there are a plurality of sensing blocks DB1 to SBn each consisting of four triangular sensing planes 62a to 62b which form a quadrangular pyramid. Each of the sensing planes 62a to 62b have a pickup coil 24. In the sensing portion 22, not only the apexes E1 to En but intersections L1 to Lm at its base are effectively used as evaluation positions of the present invention.

A fourth embodiment of the present invention will now be described according to FIG. 12.

This embodiment relates to the number of pickup coils mounted on one sensing plane. The structure of the sensing planes according to FIG. 12 is the same as FIG. 10, but two pickup coils 24 and 24 are each mounted on the same sensing plane.

As exemplified in FIG. 12, a plurality of pickup coils 24 . . . 24 can be mounted on one sensing plane. Thus, in case that one of the pickup coils 24 . . . 24 is out of order because of accidents and so on, the remaining pickup coils can be used as a substitute. This increases remarkably the reliability of the measuring apparatus.

A fifth embodiment of the present invention will now be described with reference to FIGS. 13 to 15.

In the present embodiment, the sensing portion 22 is further improved by adopting a piled structure.

Figure 13:
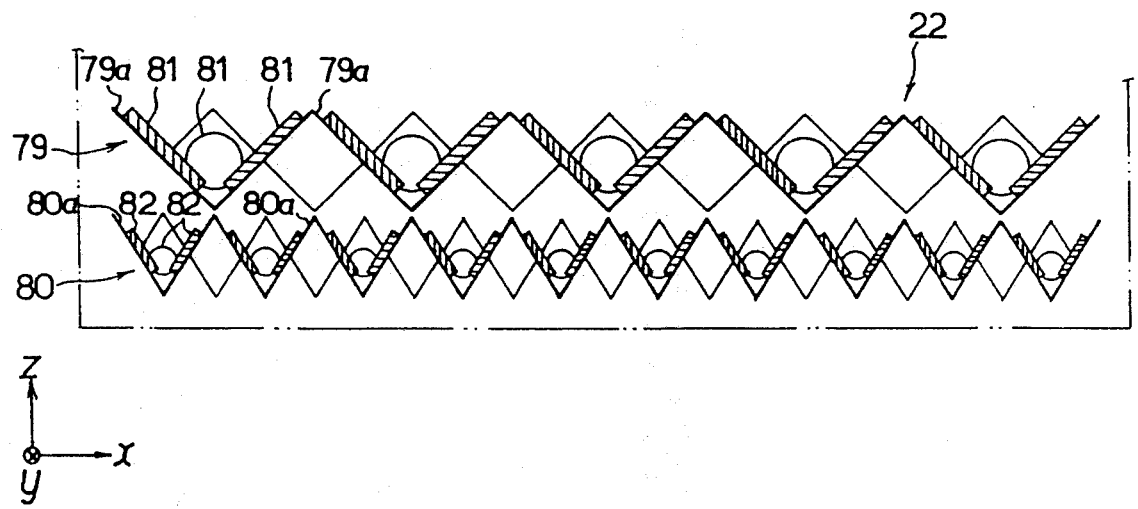
FIG. 13 shows a sensing portion of a fifth embodiment of the present invention.

As shown in FIG. 13, two substrates 79 and 80 are provided and disposed apart by an appropriate distance in the z-direction, so that they make a piled structure. Both substrates 79 and 80 are formed into a chopping-wave like shape each as explained in the first embodiment, but there is a difference in angle to the x-y plane between sensing planes 79a . . . 79a of one substrate 79 and sensing planes 80a . . . 80a of the other substrate 80.

Two types of pickup coils, 81 . . . 81 and 82 . . . 82 are provided. One type of pickup coil 81 is bigger than the other type of pickup coil 82 in the diameter of an area through which lines of magnetic force pass. The pickup coils 81 . . . 81 are mounted on each of the larger sensing planes 79a . . . 79a of the substrate 79, while the pickup coils 82 . . . 82 are mounted on each of the smaller sensing planes 80a . . . 80a of the substrate 80.

Figure 14:
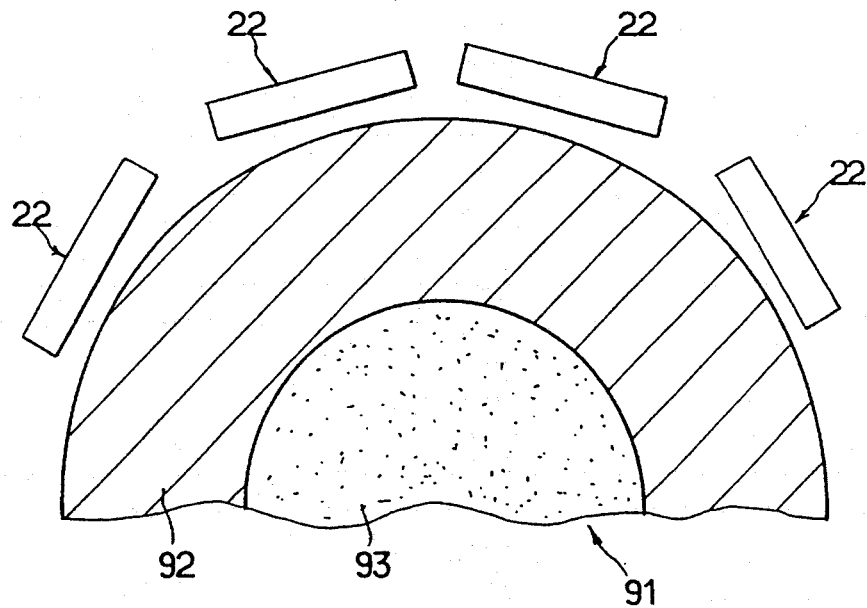
FIG. 14 is a cross-sectional view illustrating the arrangement of a plurality of sensing portions in the fifth embodiment.

Such sensing portions 22 are disposed at four places around a patient's head 91, as shown in FIG. 14. Generally, the head 91 is divided into two regions 92 and 93 in terms of medical interest. One region 92 is a portion corresponding to brain cortex, while the other region 93 includes thalamus and basal ganglia, which is deeper inside the patient's head 91.

The diameter of an area for receiving lines of magnetic force of the upper pickup coils 81 . . . 81 in one group have an appropriate value whereby it is possible to detect lines of magnetic force emanated from not only the shallower region 92 but also the deeper region 93. Each diameter of the lower pickup coils 82 . . . 82, however, is determined to be able to detect lines of magnetic force emanated from only the shallower region 92.

The picked-up signals by both types of pickup coils 81 . . . 81 and 82 . . . 82 are then sent to the data process circuit 45, via the SQUIDs 25 . . . 25 and the drive circuits 35 . . . 35.

Using the voltage signals sent from the drive circuit 35 . . . 35, the data process circuit 45 calculates for every region, as shown in FIG. 15, the current intensities and positions of current dipoles in the head 91.

First, a plurality of positions of current dipoles are assumed and given for the regions 92 and 93 (refer to Step S10 in FIG. 15). Then, in the same way as the first embodiment, relational expressions between each component of each current dipole and magnetic field intensities at given evaluation positions are determined (refer to Step S11). For evaluation at the evaluation positions, it is taken into account that the upper pickup coils 81 . . . 81 pick up lines of magnetic force from both regions 92 and 93.

So, by the same procedure as the first embodiment, the current components and positions of current dipoles within the shallow region 92 are measured by the signals from the lower pickup coils 82 . . . 82 (measurement I: Step S11a). Then, magnetic fields are calculated, the magnetic fields being sensed at the upper pickup coils 81 . . . 81 and produced by the current dipoles in the shallow region 92 which have been measured at Step S11a (Step S11b). Then, the calculated values (for the shallow region 92 to the upper pickup coils 81 . . . 81) are subtracted from the picked-up magnetic fluxes at the upper pickup coils 81 ... 81, thus only the fluxes from the deeper region 93 being obtained by upper pickup coils 81 ... 81 (Step S11c). Finally, using the subtracted magnetic flux values, the current components and positions of current dipoles in the deeper region 93 are measured by the same calculation as the first embodiment (measurement II: Step S11d).

As a result, at the measurement I and II, the expected information of current dipoles in the head 91 is acquired region by region along the depth direction of the head. In the measurement, the combination of the pickup coils 81 ... 81 and 82 ... 82 enables higher spatial resolution to a shallower examination region and also adequate spatial resolution to a deeper examination region.

In regard to the piled structure, the present invention is not limited to the above-said double piled structure. If required, an object being measured may be divided into three or more regions in its depth direction, and correspondingly one by one to the divided regions, a number of piled pickup coil groups may be used. According to the divided regions, the above subtraction technique is carried out, so that the current components and positions of current dipoles in the regions are obtained at every region.

Figure 16:
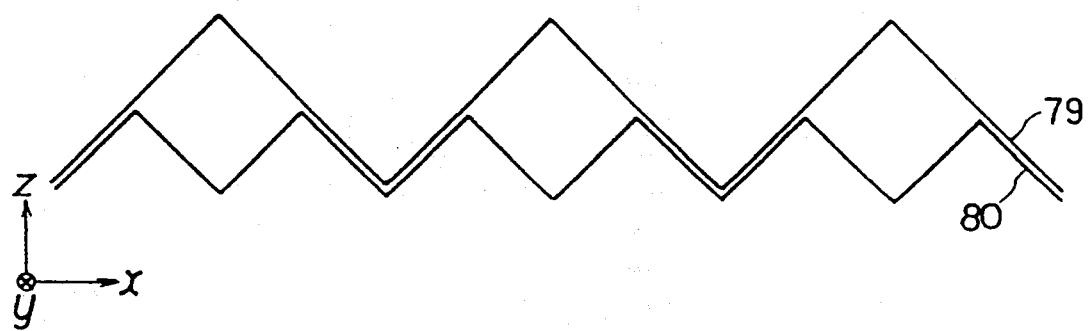
FIG. 16 is a side view showing a still further variation of a sensing portion of the present invention.
Figure 17:
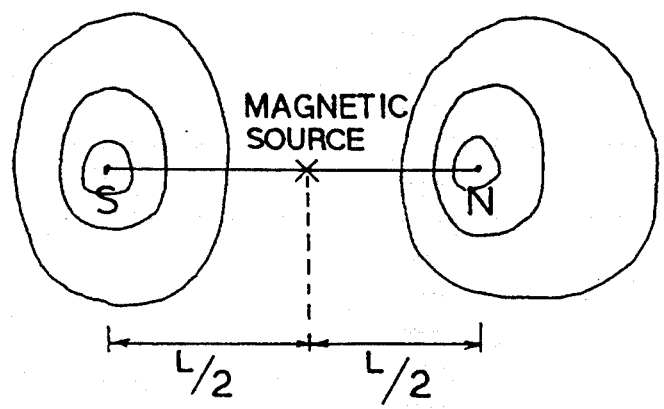
FIG. 17 is a distribution map of magnetic sources.
Figure 18:
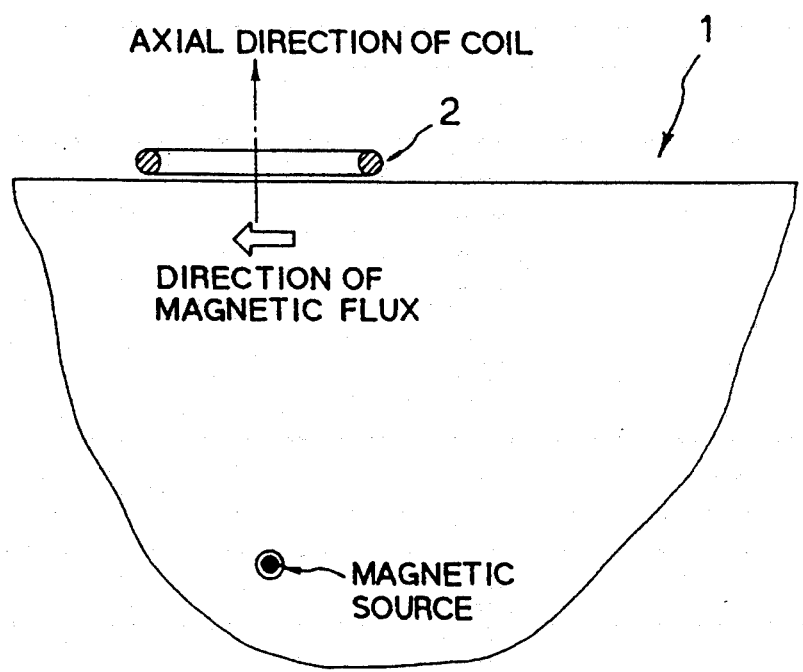
FIG. 18 is also a plan view showing a conventional arrangement of a pickup coil.

Further, as shown in FIG. 16, it is possible to place the upper substrates 79 and 80 face down, respectively, and they are piled in proximity with each other, with almost no distance therebetween.

It is also accepted that the z-directional positions of both substrates 79 and 80 are exchanged, the substrate 79 having larger pickup coils 81 ... 81 being closer to a patient body and the substrate 80 having smaller pickup coils 82 ... 82 being farther from the body.

Furthermore, a distribution map of magnetic fields may be used. Although the pickup coils are obliquely arranged to the x-y measuring plane, pickup coils having different diameters for the flux receiving area may be arranged so that their axial directions are toward the normal direction of the measuring plane. Hence, magnetic fields due to a plurality of regions divided as seen in the fifth embodiment are evaluated in every region, the magnetic fluxes being sensed by the pickup coils having different diameters. Then the distribution maps of magnetic fields are drawn for every examination region, respectively, on the basis of the evaluated magnetic fields. Such distribution maps are used to determine the positions of current dipoles at every examination region. This technique enables magnetic sources in shallower regions to be measured with higher measurement accuracy and those in deeper regions to be measured with specified measurement accuracy.

What is claimed is:

1. An apparatus for measuring a magnetic source existing in an object to be examined and producing a magnetic field outside the object, the apparatus comprising:

means for detecting the magnetic field, the detecting means having a sensing portion adapted to be placed in proximity with the object and including an observing plane consisting of a plurality of sensing blocks each containing at least three sensing planes on which a magnetic sensor is mounted, normal directions to the sensing planes being different from each other, means for evaluating three-dimensionally intensities of the magnetic field at a given plurality of evaluation positions on the observing plane using the magnetic field detected by the detecting means; and means for obtaining positional information and quantity information of the magnetic source using the intensities of the magnetic field evaluated by the evaluating means.

2. An apparatus according to claim 1, wherein the sensing planes of each of the sensing blocks are coupled at side edges of the sensing planes with each other to form a pyramid-like shape and the plurality of sensing blocks are coupled with each other to form the observing plane facing the object, the observing plane having a two-dimensional uneven shape containing a plurality of apexes made by coupling the side edges of the sensing planes.

3. An apparatus according to claim 2, wherein the sensing planes contained in each of the sensing blocks are three in number.

4. An apparatus according to claim 3, wherein each of the sensing planes is square in shape.

5. An apparatus according to claim 4, wherein the pyramid-like shape is an inverted triangular pyramid-like shape to the object.

6. An apparatus according to claim 2, wherein the sensing planes contained in each of the sensing blocks are four in number.

7. An apparatus according to claim 6, wherein each of the sensing planes is square in shape.

8. An apparatus according to claim 7, wherein the pyramid-like shape is an inverted quadrangular pyramid-like shape.

9. An apparatus according to claim 7, wherein each of the sensing planes is triangular in shape.

10. An apparatus according to claim 9, wherein said pyramid-like shape is a quadrangular pyramid-like shape to the object.

11. An apparatus according to claim 2, wherein the observing plane is formed by one base plate.

12. An apparatus according to claim 11, wherein the magnetic sensor is a pickup coil sensing inductively the magnetic field produced by the current dipoles, the pickup coil being formed on each of the sensing planes.

13. An apparatus according to claim 12, wherein the sensing portion includes a superconducting quantum interference device to receive a signal picked up by the pickup coil, the superconducting quantum interference device forming a magnetometer.

14. An apparatus according to claim 11, wherein the magnetic sensor is a superconducting quantum interference device sensing inductively the magnetic field produced by the current dipoles, and the superconducting quantum interference device is disposed each of the sensing planes.

15. An apparatus according to claim 2, wherein the obtaining means comprises:

means for specifying assumed positions of the current dipoles in a given three-dimensional region of the body, means for determining a relational expression between each directional component of each of the current dipoles at each of the assumed positions and each directional component of the magnetic field produced at each of the evaluation positions, and means for calculating each of the directional components of the current dipoles at the assumed positions on the basis of the intensities of the magnetic field evaluated by the evaluating means and the relational expression.

16. An apparatus according to claim 15, wherein the evaluation positions consist of a plurality of intersections of the side edges of the sensing planes.

17. An apparatus according to claim 16, wherein the intersections are the apexes.

18. An apparatus according to claim 16, wherein the evaluating means includes means for evaluating the intensities of the magnetic field at at least two of the intersections using the same magnetic fields detected from the same sensing planes detected by the detecting means.

19. An apparatus according to claim 2, wherein the observing plane is formed by a plurality of base plates piled in the depth direction and separated from each other by a given distance.

20. An apparatus according to claim 19, wherein the magnetic sensors mounted on the sensing planes of the plurality of base plates vary in measurement sensitivity depending on the base plate.

21. An apparatus according to claim 20, wherein the plurality of base plates are two in number.

22. An apparatus according to claim 21, wherein the magnetic sensors are pickup coils sensing inductively the magnetic field produced by the current dipoles, and the pickup coils is disposed on the sensing planes.

23. An apparatus according to claim 22, wherein each of the pickup coils form a receiving area for the magnetic field, the receiving area varying depending upon the base plate.

24. An apparatus according to claim 20, wherein the obtaining means comprises:

means for specifying assumed positions of the current dipoles in a given three dimensional region of the body, means for determining a relational expression between each directional component of each of the current dipoles at each of the assumed positions and each directional component of the magnetic field produced at each of the evaluation positions, and means for calculating each of the directional components of the current dipoles at the assumed positions on the basis of the intensities of the magnetic field evaluated by the evaluating means and the relational expression.

25. An apparatus according to claim 24, wherein the specifying means includes means for specifying the assumed positions using every base plate, the determining means includes means for determining the relational expression using every base plate, and the calculating means includes means for calculating each of the directional components of the current dipoles using every base plate.

26. An apparatus according to claim 2, wherein the object has a curved surface and the observing plane is curved in conformity to the curved surface.

27. An apparatus according to claim 2, wherein the magnetic sensor mounted on each of the sensing planes is single in number.

28. An apparatus according to claim 2, wherein the magnetic sensor mounted on each of the sensing planes consists of a plurality of magnetic sensors.

29. An apparatus according to claim 28, wherein the magnetic sensor is two in number.

* * * * *

UNITED STATES PATENT AND TRADEMARK OFFICE
CERTIFICATE OF CORRECTION

PATENT NO.   : 5,437,276
DATED        : August 1, 1995
INVENTOR(S)  : Youichi Takada It is certified that error appears in the above-indentified patent and that said Letters Patent is hereby corrected as shown below:

Col. 7, line 49, change "$H_2$" to --$H_z$--.

Col. 8, equation (5) should read:

$\{H_y\} = [G_{yx}]\{I_x\} + [G_{yz}]\{I_z\}$

Col. 12, equation (21) should read:

$$\begin{bmatrix} B_{y2} \\ B_{x1} \\ B_{y1} \end{bmatrix} = \begin{bmatrix} K_2 & 0 & K_2 \\ 0 & K_1 & -K_1 \\ -K_1 & 0 & K_1 \end{bmatrix} \begin{bmatrix} I_{x1} \\ I_{y1} \\ I_{z1} \end{bmatrix} \qquad (21)$$

Signed and Sealed this

Eighteenth Day of June, 1996

Attest:

BRUCE LEHMAN

*Attesting Officer*          *Commissioner of Patents and Trademarks*

UNITED STATES PATENT AND TRADEMARK OFFICE
CERTIFICATE OF CORRECTION

PATENT NO. : 5,437,276
DATED : August 1, 1995
INVENTOR(S) : Youichi Takada

It is certified that error appears in the above-indentified patent and that said Letters Patent is hereby corrected as shown below:

Col. 7, line 18, change the equation from "B=$\mu^H$" to --B=$\mu$H--;

Col. 7, line 49, change "H$_2$" to --H$_z$--;

Col. 8, line 3, change "20" to --2B--;

Col. 8, equation (5) should read:

$$\{H_y\} = [G_{yx}]\{I_x\} + [G_{yz}]\{I_z\}$$

Col. 12, equation (21) should read:

$$\begin{bmatrix} B_{y2} \\ B_{x1} \\ B_{y1} \end{bmatrix} = \begin{bmatrix} K_2 & 0 & K_2 \\ 0 & K_1 & -K_1 \\ -K_1 & 0 & K_1 \end{bmatrix} \begin{bmatrix} I_{x1} \\ I_{y1} \\ I_{z1} \end{bmatrix} \qquad (21)$$

Signed and Sealed this

Tenth Day of September, 1996

Attest:

BRUCE LEHMAN

*Attesting Officer*     *Commissioner of Patents and Trademarks*